(12) United States Patent
Pan et al.

(10) Patent No.: US 8,129,728 B2
(45) Date of Patent: Mar. 6, 2012

(54) LIGHT EMITTING DEVICE AND METHOD FOR ENHANCING LIGHT EXTRACTION THEREOF

(75) Inventors: Chang-Chi Pan, Taoyuan (TW); Ching-hwa Chang Jean, Taoyuan (TW); Jang-ho Chen, Taoyuan (TW)

(73) Assignee: Walsin Lihwa Corporation, Taoyuan (TW)

( * ) Notice: Subject to any disclaimer, the term of this patent is extended or adjusted under 35 U.S.C. 154(b) by 0 days.

(21) Appl. No.: 12/588,637

(22) Filed: Oct. 22, 2009

(65) Prior Publication Data

US 2011/0095314 A1    Apr. 28, 2011

(51) Int. Cl.
*H01L 27/15* (2006.01)

(52) U.S. Cl. ............ 257/79; 257/E33.023; 438/29; 438/48

(58) Field of Classification Search .......... 257/98, 257/99, 79, E33.023; 438/29, 48
See application file for complete search history.

(56) References Cited

U.S. PATENT DOCUMENTS

| 2006/0022191 A1* | 2/2006 | Bakkers et al. ............ 257/40 |
| 2007/0085102 A1* | 4/2007 | Orita ....................... 257/98 |
| 2007/0158661 A1* | 7/2007 | Lu et al. .................. 257/79 |

* cited by examiner

*Primary Examiner* — David Vu
(74) *Attorney, Agent, or Firm* — Chen Yoshimura LLP

(57) ABSTRACT

A method for enhancing light extraction of a light emitting device is disclosed. The method includes the steps of: providing a site layer on the light emitting device; placing a protection layer on the site layer; forming an array of pores through the protection layer and the site layer; and growing on the site layer an oxide layer, having a plurality of rods, each of which is formed in one of the pores. The shapes of the rods can be well controlled by adjusting reactive temperature, time and $N_2/H_2$ concentration ratio of atmosphere such that the shape and light escape angle of the rods can be changed.

12 Claims, 8 Drawing Sheets

LIGHT EMITTING DEVICE AND METHOD FOR ENHANCING LIGHT EXTRACTION THEREOF

FIELD OF THE INVENTION

The present invention relates to a method for enhancing light extraction of a light emitting device. More particularly, the present invention relates to a method for enhancing light extraction of a light emitting device by forming an oxide layer, such as a zinc oxide layer, with a controllable roughness on the light emitting device.

BACKGROUND OF THE INVENTION

Recently, since development of integrated circuits (IC) has been down sized to nano-scale, application to nano-scale elements becomes more and more popular. Among all inventions, short-wavelength light emitting devices, such as laser diodes (LD) and light emitting diodes (LED), have been the mainstream. For development of short-wavelength light emitting devices, III-V compounds semiconductors are the common materials for manufacturing LED. However, with development of new systematic materials, II-VI compounds semiconductors are valued again. In practice, Zinc oxide (ZnO) has advantages of low cost and easy synthesis. Hence, study on ZnO is a hot topic today, especially on the ZnO nanorods.

ZnO has a direct band-gap of 3.37 eV which is higher than other high direct band-gap semiconductor materials. In addition, ZnO has higher excitation binding energy (excitation binding energy of Gallium Nitride (GaN) is around 20 meV while that of ZnO is much higher and about 60 meV.). Therefore, its lighting efficiency is higher than other materials under room temperature. During recent years, a lot of reports on study of ZnO show that it can be applied to short-wavelength elements and laser diodes due to the good lighting efficiency. Since data accessing can be improved by using ultraviolet (UV) laser, application of ZnO to UV laser source has a great potential. For ZnO, membrane elements are very popular.

Besides, another main direction of development of ZnO is one-dimensional nanorods (nanowires). Scientists can grow highly aligned nanorod array successfully. With photoluminescence, UV laser is excited out of the nanorods. Although UV laser can be commercialized in many ways, how to enhance light extraction and control light escape angle of nanorods still has two problems to be solved. Otherwise, lighting efficiency will be significantly affected.

Therefore, the present invention provides a solution to the problems mentioned above. Via the invention, light extraction of a light emitting device can be enhanced.

SUMMARY OF THE INVENTION

Accordingly, it is an object of the present invention to provide a method for enhancing light extraction of a light emitting device by forming an oxide layer with a controllable roughness on the light emitting device.

In accordance with an aspect of the present invention, a method for enhancing light extraction of a light emitting device, includes the steps of: providing a site layer on the light emitting device; placing a protection layer on the site layer; forming an array of pores through the protection layer and the site layer; and growing on the site layer an oxide layer, having a plurality of rods, each of which is formed in one of the pores. The shapes of the rods can be well controlled by adjusting $N_2/H_2$ concentration ratio, reactive temperature and time such that the shape and light escape angle of the rods can be changed.

Preferably, the oxide layer comprises zinc oxide (ZnO), silicon dioxide ($SiO_2$), titanium dioxide ($TiO_2$), or aluminum oxide ($Al_2O_3$).

Preferably, the oxide layer is formed by hydrothermal treatment, sol-gel method, electro-plating, thermal evaporation, chemical vapor deposition (CVD), or molecular beam epitaxy (MBE).

Preferably, the site layer comprises ITO, Ni/Au, NiO/Au, p-ZnO, or ZnO.

Preferably, the protection layer comprises photoresist material or dielectric material.

Preferably, the atmosphere temperature is higher than 200° C.

Preferably, the atmosphere comprises nitrogen, hydrogen, or a mixture thereof.

Preferably, the atmosphere has a nitrogen/hydrogen concentration ratio larger than 1.

Preferably, the rods have a nanostructure or a microstructure.

Preferably, the rods have a shape of a hexagonal pyramid or a truncated hexagonal pyramid.

Preferably, the rod has a bottom surface with a diameter ranging from 100 nm~order of micrometers.

Preferably, the pores are formed by wet etching process, dry etching process, photolithography and exposure development process, laser cutting process, or electron beam writing process.

In accordance with another aspect of the present invention, a light emitting device having enhanced light extraction includes a light emitting substrate; a site layer provided on the light emitting substrate; an array of pores formed in the site layer; a protection layer placed on the site layer having the pores exposed; and an oxide layer formed on the site layer, having a plurality of rods, each of which is formed in one of the pores. The shapes of the rods are adjusted by controlling temperature and concentration of atmosphere such that light escape angle of the rods can be changed.

Preferably, the oxide layer comprises zinc oxide (ZnO), silicon dioxide ($SiO_2$), titanium dioxide ($TiO_2$), or aluminum oxide ($Al_2O_3$).

Preferably, the oxide layer is formed by hydrothermal treatment, sol-gel method, electro-plating, thermal evaporation, chemical vapor deposition (CVD), or molecular beam epitaxy (MBE).

Preferably, the site layer comprises ITO, Ni/Au, NiO/Au, p-ZnO, or ZnO.

Preferably, the protection layer comprises photoresist material or dielectric material.

Preferably, the atmosphere temperature is higher than 200° C.

Preferably, the atmosphere comprises nitrogen, hydrogen, or a mixture thereof.

Preferably, the atmosphere has a nitrogen/hydrogen concentration ratio larger than 1.

Preferably, the rods have a nanostructure or a microstructure.

Preferably, the rods have a shape of a hexagonal pyramid or a truncated hexagonal pyramid.

Preferably, the rod has a bottom surface with a diameter ranging from 100 nm~order of micrometers.

Preferably, the pores are formed by wet etching process, dry etching process, photolithography and exposure development process, laser cutting process, or electron beam writing process.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiment. It is to be noted that the following descriptions of preferred embodiment of this invention are presented herein for purpose of illustration and description only; it is not intended to be exhaustive or to be limited to the precise form disclosed.

Figure 1:
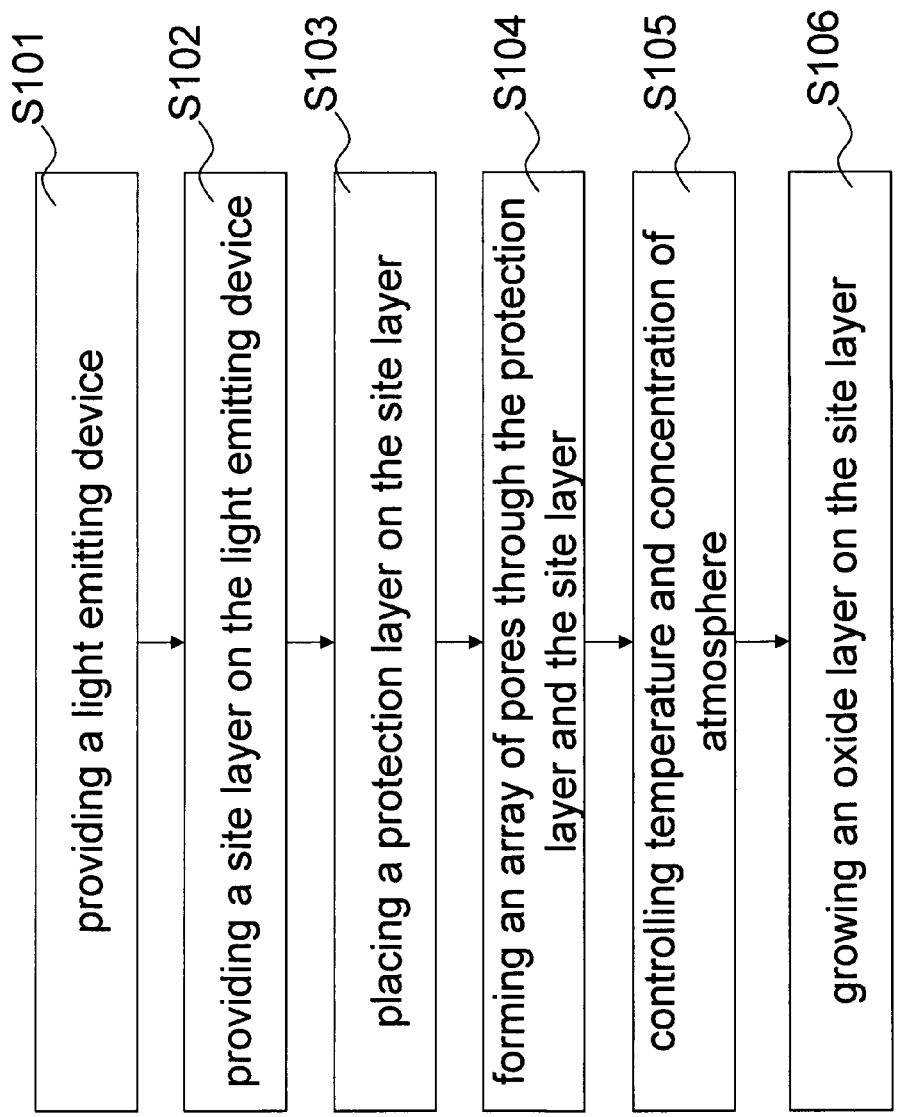
FIG. 1 is a flow chart of a preferred embodiment according to the present invention.
Figure 2:
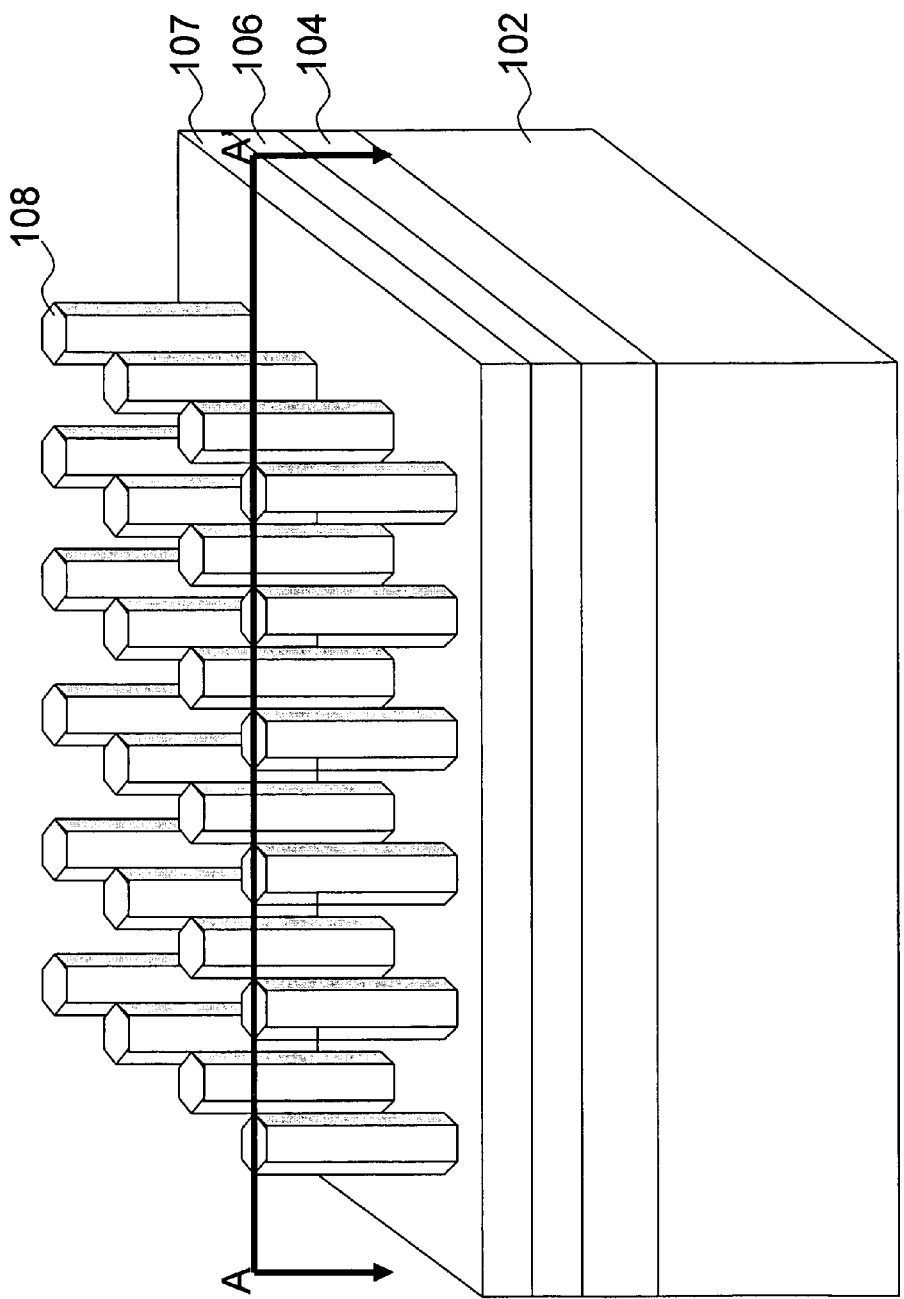
FIG. 2 is a three dimensional view of the present invention.

FIG. 1 is a flow chart of a preferred embodiment according to the present invention showing a method for enhancing light extraction of a light emitting device by forming an oxide layer with a controllable roughness on a light emitting device. FIG. 2 is a three dimensional view of the present invention. It also shows the relative position for each element in the present invention. Now, please refer to FIGS. 1 and 2. The method of the present invention for enhancing light extraction of a light emitting device by forming an oxide layer with a controllable roughness on a light emitting device includes the following steps. First, a light emitting device 102 having a surface layer 104 formed on the top surface thereof is provided (as shown at step S101). In this embodiment, the surface layer 104 is made of p-GaN. However, it should be noted that the surface layer 104 of the present invention is not limited to p-GaN. It can also be made of p-AlGaN, p-InGaN, p-GaN/InGaN SLs, p-AlGaN/GaN SLs, p-AlInGaN, p-InAlGaN/InAlGaN SLs, n+-(In)(Al)GaN, ITO, p-ZnO, ZnO, or Ni/Au. In other words, the surface layer 104 is not limited to a conductive type of P or N.

The light emitting device 102 used in this embodiment is a nitride light emitting diode which has an energy band gap equivalent to wavelength of 200 to 650 nm.

Later, a site layer 106 is provided on the surface layer 104 of the light emitting device 102 (as shown at step S102). The site layer 106 can be made of ITO, Ni/Au, NiO/Au, p-ZnO, or ZnO.

Figure 3:
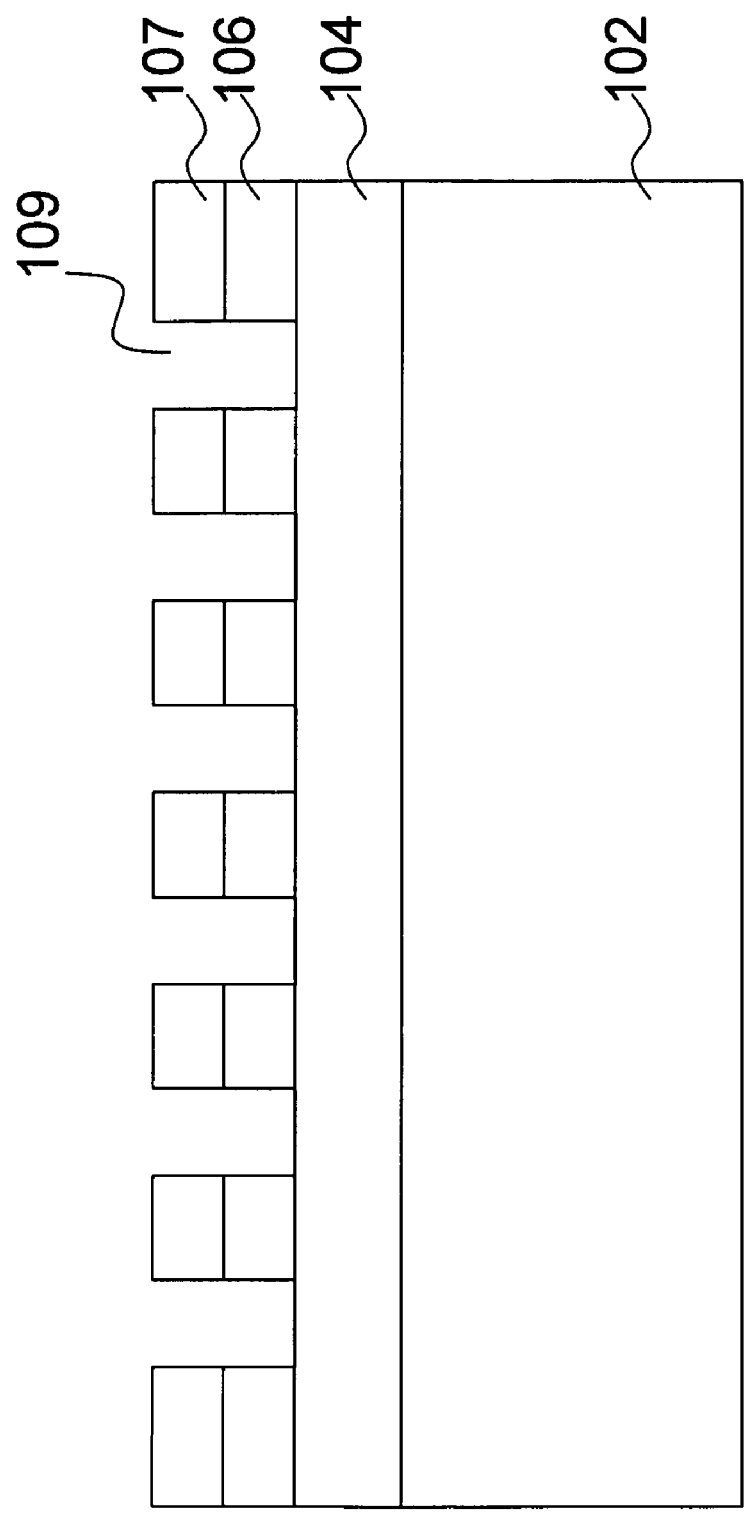
FIG. 3 is a cross-sectional view along the A-A' cross section in FIG. 2 to show formation of pores.

Next, a protection layer 107 is placed on the site layer 106 (as shown at step S103). Please refer to FIG. 3. It is a cross-sectional view along the A-A' cross section in FIG. 2. An array of pores 109 are formed through the protection layer 107 and the site layer 106 by wet etching process, dry etching process, photolithography and exposure development process, laser cutting process, or electron beam writing process (as shown at step S104). The protection layer 107 is made of photoresist material while photolithographic process is used, whereas the protection layer 107 is made of dielectric material while etching process is used.

Then, an oxide layer having a plurality of rods 108 is grown on the site layer 106 such that each of the rods 108 is formed in one of the pores 109. The protection layer 107 is for positioning the rods 108 into the pores 109 and preventing the rods 108 from growing at a place other than the pores 109.

The shapes of the rods 108 are adjusted by controlling temperature and concentration of atmosphere such that light escape angle of the rods can be changed (as shown at steps S105~S106).

The oxide layer can be made of zinc oxide (ZnO), silicon dioxide ($SiO_2$), titanium dioxide ($TiO_2$), or aluminum oxide ($Al_2O_3$). In this embodiment, the oxide layer is made of ZnO.

In this embodiment, the oxide layer is formed by hydrothermal treatment. First, the light emitting device including the site layer is cleaned with acetone, methanol, and deionized water for about 5 minutes, respectively. Then, the light emitting device and the site layer are dried by a nitrogen spray gun. Next, a seed layer of ZnO is formed on the site layer for increasing adhesion. The light emitting device, site layer, and seed layer is together called a mediator.

The seed layer of ZnO is prepared by dissolving zinc acetate ($Zn(CH_3COO)_2 \cdot H_2O$) in 2MOE ($CH_3O(CH_2)_2OH$, 2-methoxyethanol), each having a concentration of 0.5M, and then stirring the resultant solution for 2 hours while heating at a temperature of 65° C., so that a transparent gel solution is obtained. Later, the transparent gel solution is spin coated onto the top surface of the site layer. Next, a ZnO seed layer is obtained by thermal annealing having the transparent gel solution deposited thereon at a temperature of 130° C. for 60 minutes. In this embodiment, the ZnO seed layer is used for ZnO particles to grow as a ZnO layer.

It should be understood that the seed layer is not limited to be made of ZnO, and can also be made of gold (Au), silver (Ag), Tin (Sn), or cobalt (Co). The oxide layer may be formed randomly or orderly.

After the seed layer is formed, the mediator is placed facing downwards in a growth solution of zinc nitrate hexahydrate ($Zn(NO_3)_2 \cdot 6H_2O$) having a purity of 98% and hexamethylenetetramine ($C_6H_{12}N_4$, HMT) having a purity of 99.5%, each having a concentration of 0.5M. Later, it is heated in a dryer at a low temperature of 90° C. for about 3 hours. After being heated, it is taken out and washed with deionized water. Then, a ZnO layer having a plurality of rods could be obtained. Otherwise, the growth rate, dimension and height of ZnO rods can be well controlled by adjusting the temperature, concentration and growth time.

During the hydrothermal treatment, ZnO is formed according to the following formulas:

$$Zn^{2+} + 2OH^- \longrightarrow Zn(OH)_2$$

$$Zn(OH)_2 \xrightarrow{\Delta} ZnO + H_2O.$$

In the aforementioned deposition mechanism, ZnO begins to form onto the seed layer once the concentrations of zinc ions and hydroxide ions reach saturation. Due to anisotropic characteristic of atomic bonding, atoms tend to flow towards low energy during nucleation causing asymmetric growth in a specific direction which thereby forms a rod/thread shape array structure.

Although hydrothermal treatment is used in the present embodiment, it should be understood that the present invention is not limited to hydrothermal treatment, and can also use thermal evaporation, sol-gel method, chemical vapor deposition (CVD), or molecular beam epitaxy (MBE).

Moreover, even though spin coating is used for disposing the seed layer onto the GaN substrate in the present embodiment, it should not be limited thereto, and can also use dip coating, evaporation, sputtering, atomic layer deposition, electrochemical deposition, pulse laser deposition, metal-organic chemical vapor deposition, or thermal annealing.

The atmosphere can include nitrogen, hydrogen, or a mixture thereof. In this embodiment, the atmosphere has a nitrogen/hydrogen concentration ratio larger than 1 while the atmosphere includes a mixture of nitrogen and hydrogen. Moreover, the atmosphere temperature for the controllable roughness of ZnO rods is higher than 200° C.

Under the aforementioned atmosphere conditions, the rods 108 may have shapes of hexagonal pyramids or truncated hexagonal pyramids with a size order between nanometer and micrometer. The rods 108 have a bottom surface with a diameter ranging from 100 nm~order of micrometers.

Figure 4:
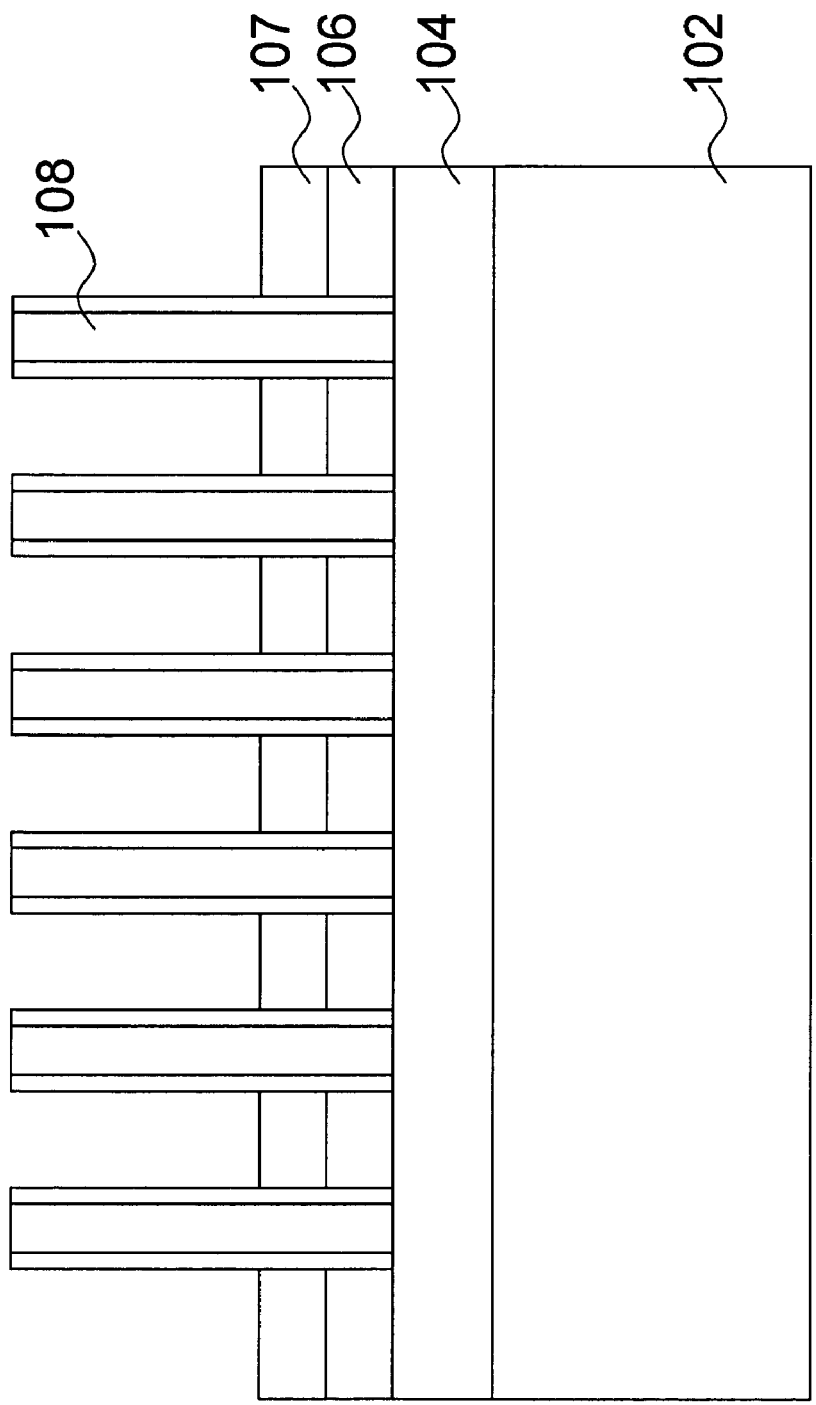
FIG. 4 is cross-sectional view along the A-A' cross section in FIG. 2 to show formation of rods.
Figure 5:
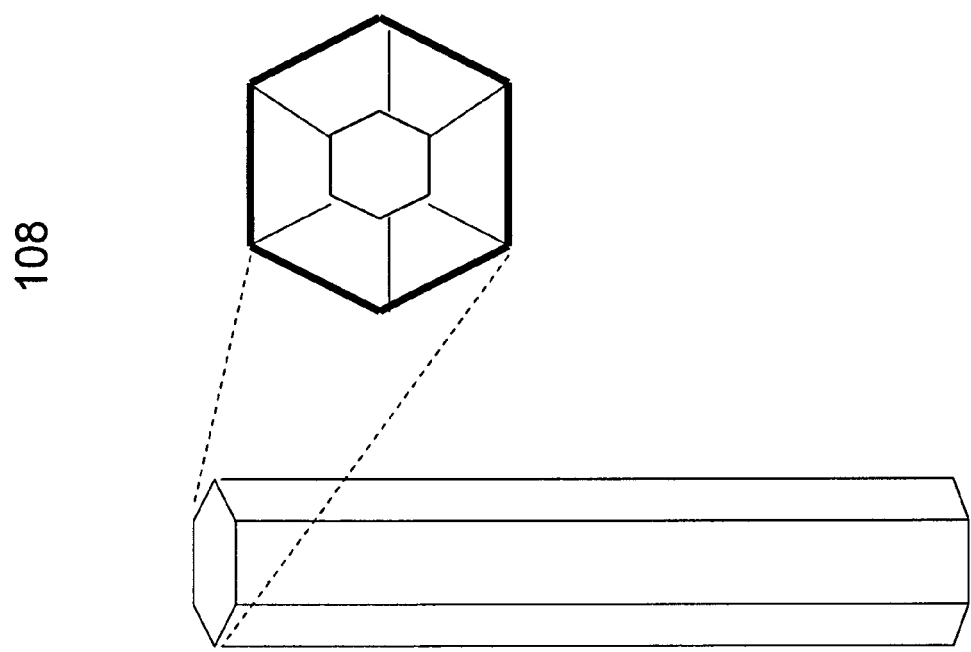
FIG. 5 is an enlarged view of a rod.

Please see FIG. 4. The sketch illustrates how the rods 108 of the ZnO layer are formed in the pores 109 of the site layer 106. Each rod 108 has a hexagonal cross section and a Wurtzite structure as shown in FIG. 5. In the present invention, it has a hexagonal column appearance. The light beams emit in a specified direction from the light emitting device 102 according to the structure of the rods 108.

Figure 6:
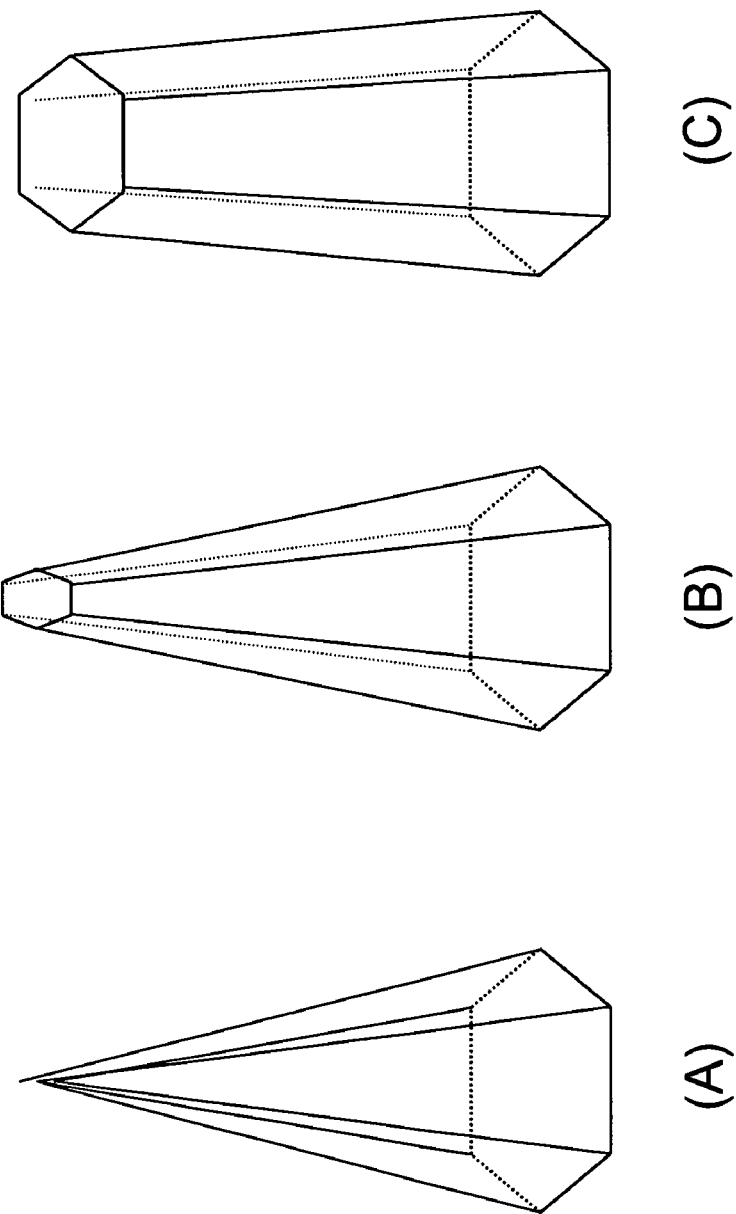
FIG. 6 shows structures of the rods formed under different atmospheres.

Please refer to FIG. 6. FIG. 6 illustrates different shapes of the rod 108 which are formed under different temperature and concentration of atmosphere conditions. For example, the rod 108 shown in FIG. 6A which is shaped as a hexagonal pyramid is formed under an atmosphere having a nitrogen/hydrogen concentration ratio smaller than that of FIG. 6C which is shaped as a truncated hexagonal pyramid. Furthermore, the rod 108 shown in FIG. 6A can also be achieved by providing a temperature higher than that of FIG. 6C. Therefore, roughness of a light emitting device can be controlled by changing the shape (sharpness) of the pyramids of the rods 108 of the oxide layer.

Figure 7:
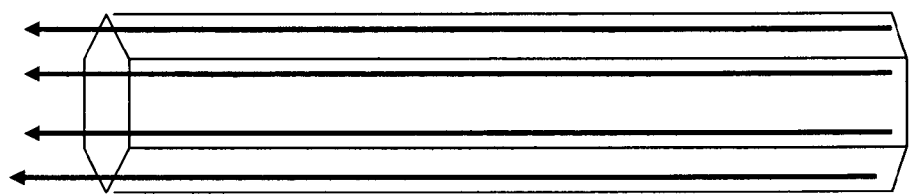
FIG. 7 shows a light path in the rod which has a shape of a hexagonal column.
Figure 8:
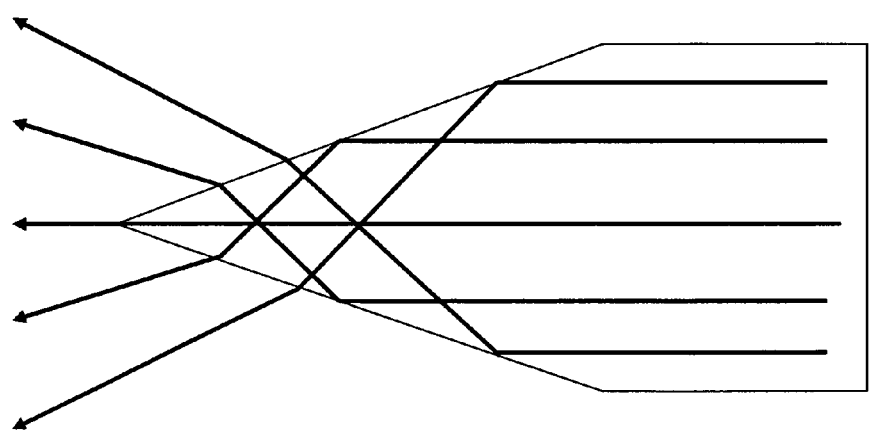
FIG. 8 shows a light path in the rod which has a shape of a hexagonal pyramid.

Please refer to FIGS. 7 and 8. These two figures show different light paths in a hexagonal prism and a hexagonal pyramid. It is obvious that the hexagonal pyramid will change light direction by refraction and increase the light escape angle, which can be compared with FIG. 7. Therefore, the light extraction of the light emitting device can be enhanced and the light escape angle can be controlled by the present invention.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A light emitting device having enhanced light extraction, comprising:
    a light emitting substrate;
    a site layer provided on the light emitting substrate;
    an array of pores formed in the site layer;
    a protection layer placed on the site layer having the pores exposed; and
    a plurality of oxide rods formed on the light emitting substrate, each of which is formed in one of the pores;
    wherein the site layer and the protection layer are formed of different materials, and wherein the shapes of the rods are controlled by adjusting reactive temperature, time and $N_2/H_2$ concentration ratio of atmosphere such that the shape and light escape angle of the rods are changed.

2. The light emitting device according to claim 1, wherein the oxide rods comprise zinc oxide (ZnO), silicon dioxide ($SiO_2$), titanium dioxide ($TiO_2$), or aluminum oxide ($Al_2O_3$).

3. The light emitting device according to claim 1, wherein the oxide rods are formed by hydrothermal treatment, sol-gel method, electro-plating, thermal evaporation, chemical vapor deposition (CVD), or molecular beam epitaxy (MBE).

4. The light emitting device according to claim 1, wherein the site layer comprises ITO, Ni/Au, NiO/Au, p-ZnO, or ZnO.

5. The light emitting device according to claim 1, wherein the protection layer comprises photoresist material or dielectric material.

6. The light emitting device according to claim 1, wherein the atmosphere temperature is higher than 200° C.

7. The light emitting device according to claim 1, wherein the atmosphere comprises nitrogen, hydrogen, or a mixture thereof.

8. The light emitting device according to claim 1, wherein the atmosphere has a nitrogen/hydrogen concentration ratio larger than 1.

9. The light emitting device according to claim 1, wherein the rods have a nanostructure or a microstructure.

10. The light emitting device according to claim 1, wherein the rods have a shape of a hexagonal pyramid or a truncated hexagonal pyramid.

11. The light emitting device according to claim 1, wherein the rod has a bottom surface with a diameter ranging from 100 nm-1 µm.

12. The light emitting device according to claim 1, wherein the pores are formed by wet etching process, dry etching process, photolithography and exposure development process, laser cutting process, or electron beam writing process.

* * * * *